(12) United States Patent
Jin

(10) Patent No.: US 9,263,452 B2
(45) Date of Patent: Feb. 16, 2016

(54) RESERVOIR CAPACITOR OF SEMICONDUCTOR DEVICE

(71) Applicant: SK HYNIX INC., Icheon (KR)

(72) Inventor: Ae Rim Jin, Namyangju (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/183,276

(22) Filed: Feb. 18, 2014

(65) Prior Publication Data
US 2014/0159131 A1 Jun. 12, 2014

Related U.S. Application Data

(62) Division of application No. 12/840,174, filed on Jul. 20, 2010, now abandoned.

(30) Foreign Application Priority Data

Nov. 24, 2009 (KR) .................. 10-2009-0113626

(51) Int. Cl.
*H01L 27/108* (2006.01)
*H01L 49/02* (2006.01)
*H01L 29/94* (2006.01)

(52) U.S. Cl.
CPC ...... *H01L 27/10829* (2013.01); *H01L 27/1085* (2013.01); *H01L 27/10805* (2013.01); *H01L 27/10814* (2013.01); *H01L 27/10852* (2013.01); *H01L 27/10876* (2013.01); *H01L 27/10885* (2013.01); *H01L 27/10888* (2013.01); *H01L 27/10894* (2013.01); *H01L 28/91* (2013.01); *H01L 29/94* (2013.01)

(58) Field of Classification Search
CPC ............ H01L 27/0629; H01L 27/0733; H01L 27/10805; H01L 27/10814; H01L 27/10847; H01L 27/10829; H01L 27/1085; H01L 27/10852; H01L 27/10885; H01L 27/10888; H01L 27/10894
USPC .................. 257/296, 301, E27.088, E27.092
See application file for complete search history.

(56) References Cited

U.S. PATENT DOCUMENTS

| 5,804,479 A | * | 9/1998 | Aoki et al. ..................... 438/253 |
| 2001/0022369 A1 | * | 9/2001 | Fukuda et al. ................ 257/207 |
| 2001/0023099 A1 | * | 9/2001 | Saito et al. .................... 438/241 |
| 2001/0025973 A1 | * | 10/2001 | Yamada et al. ............... 257/296 |
| 2002/0014648 A1 | * | 2/2002 | Mizutani et al. .............. 257/306 |
| 2009/0236908 A1 | * | 9/2009 | Park ............................... 307/19 |

(Continued)

FOREIGN PATENT DOCUMENTS

| KR | 10-2008-0087304 A | 10/2008 |
| KR | 10-2008-0098177 A | 11/2008 |
| KR | 10-2009-0061361 A | 6/2009 |

*Primary Examiner* — Eduardo A Rodela
*Assistant Examiner* — Christopher M Roland

(57) ABSTRACT

A method for fabricating a reservoir capacitor of a semiconductor device where a first peripheral circuit region and a second peripheral circuit region are defined comprises: forming a gate on an upper portion of a semiconductor substrate of the second peripheral circuit region; forming an interlayer insulating film on the entire upper portion of the semiconductor substrate including the gate; etching the interlayer insulating film of the second peripheral circuit region to form a bit line contact hole; forming a bit line material and a sacrificial film on the upper portion of the interlayer insulating film including the bit line contact hole; and etching the sacrificial film of the first peripheral circuit region to form a trench that exposes the bit line material.

13 Claims, 8 Drawing Sheets

(56) References Cited

U.S. PATENT DOCUMENTS

2010/0078696 A1* 4/2010 Kim .................. G11C 11/404
257/296

2012/0132968 A1* 5/2012 Choi .................. H01L 23/5223
257/296
2012/0135592 A1* 5/2012 Kim .............................. 438/586
2012/0217576 A1* 8/2012 Yeo .............................. 257/330

* cited by examiner

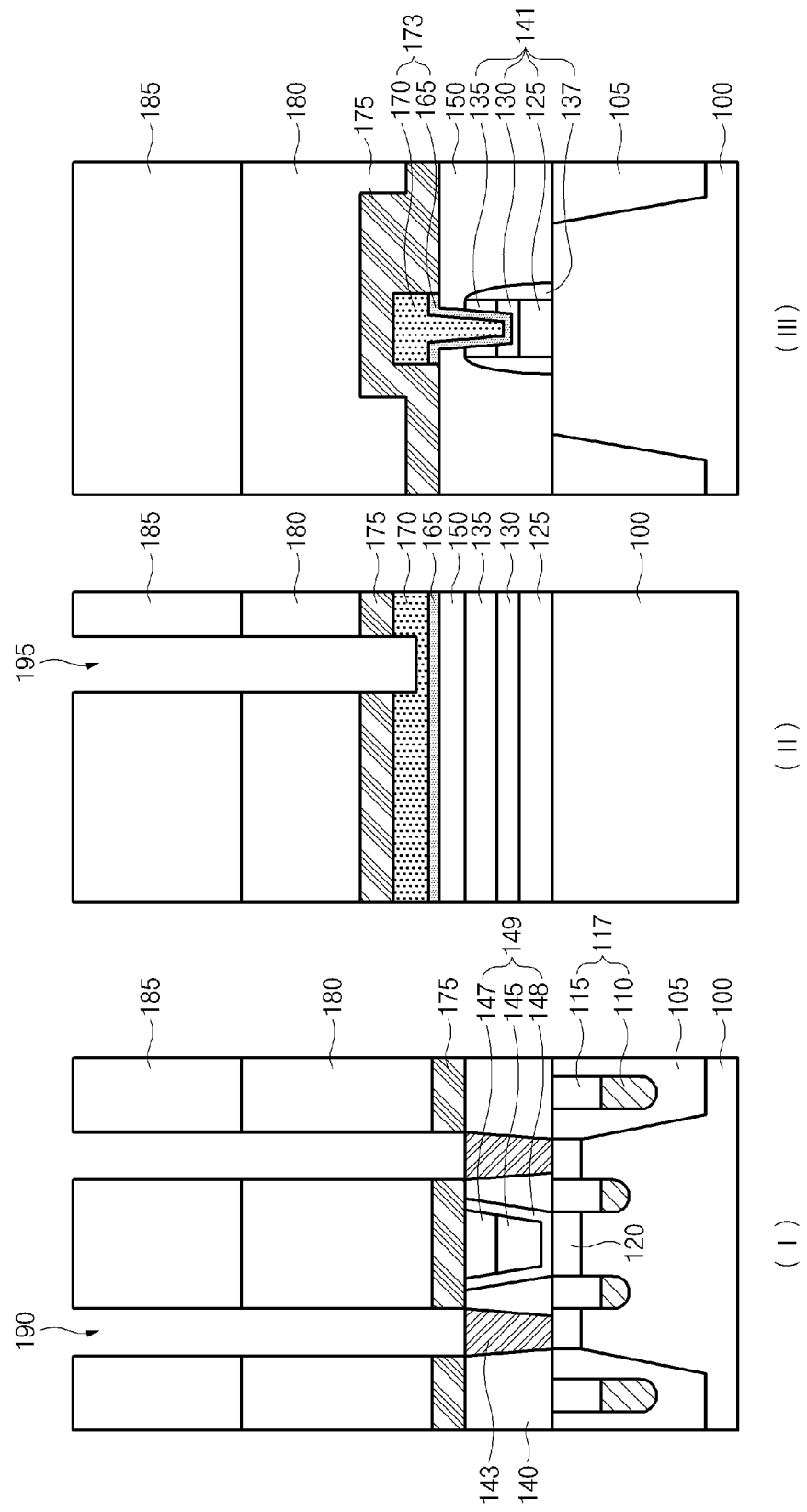

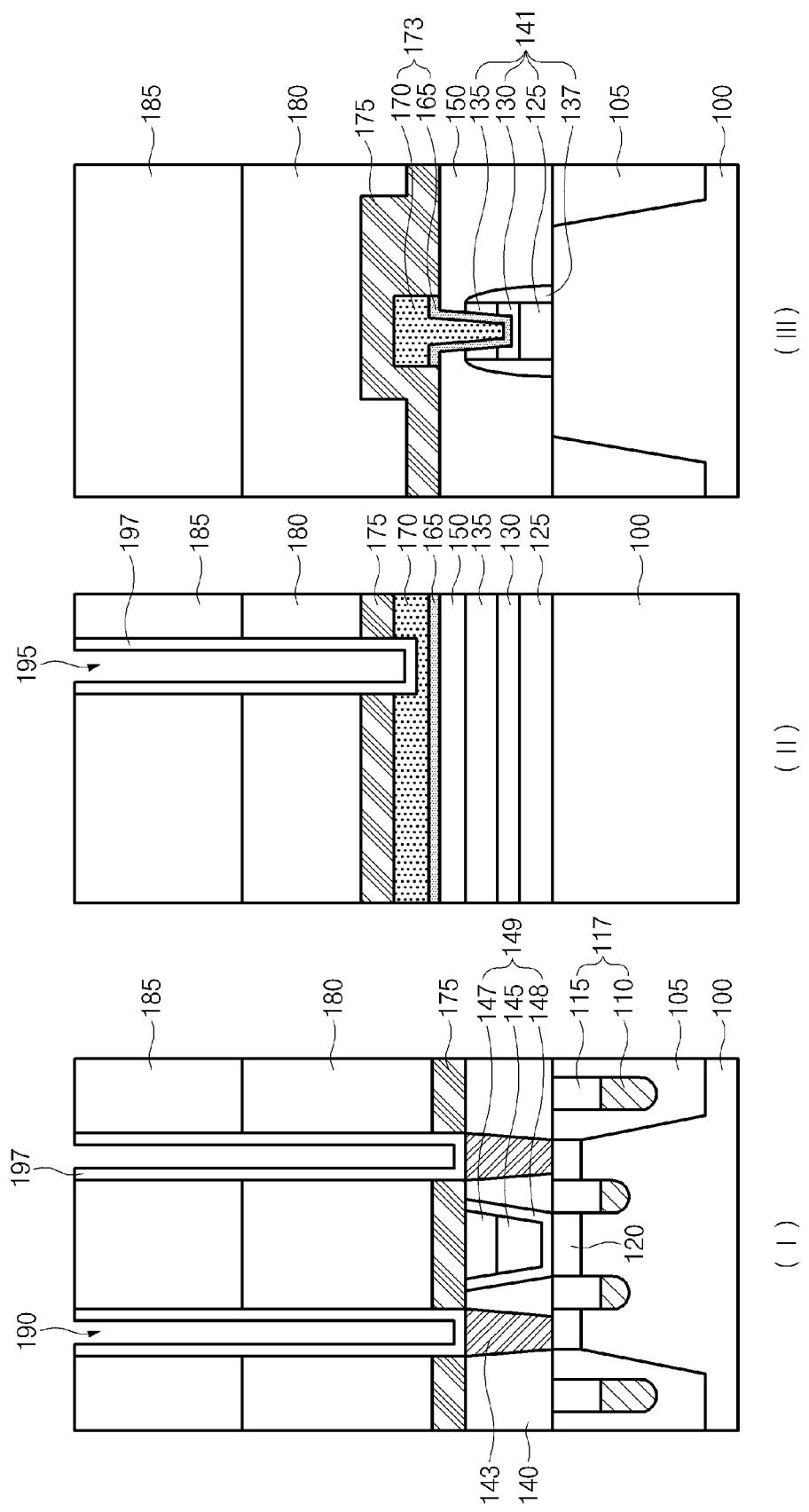

RESERVOIR CAPACITOR OF SEMICONDUCTOR DEVICE

CROSS-REFERENCE TO RELATED APPLICATION

The present application is a divisional of U.S. patent application Ser. No. 12/840,174, filed on Jul. 20, 2010, which claims priority of Korean Patent Application No. 10-2009-0113626 filed on Nov. 24, 2009, which are incorporated by reference in their entirety.

BACKGROUND OF THE INVENTION

An embodiment of the present invention relates to a reservoir capacitor of a semiconductor device and a method for fabricating the same, and more specifically, to a reservoir capacitor formed when a buried gage process is applied.

In general, a semiconductor device such as a Dynamic Random Access Memory (DRAM) comprises various micro-sized elements. In order to operate these micro-sized elements, the semiconductor device generates an internal voltage.

Meanwhile, the use of the internal voltage can generate noise, thereby destabilizing a voltage level. In order to inhibit the generation of noise, a reservoir capacitor having a large capacitance is fabricated. The reservoir capacitor is located in a peripheral circuit region where micro-sized elements are formed.

However, in the current buried gate, a storage node contact of a cell region is formed before a bit line pad of a peripheral circuit region is formed. That is, a gate of the cell region, the gate of the peripheral circuit region, a bit line of the cell region and the bit line pad of the peripheral circuit region are formed to have different heights.

As a result, the storage node contact of the cell region and the gate material of the peripheral circuit region, that is, a MOS capacitor, are formed to have the same height. When the reservoir capacitor is formed using the storage node contact, the storage node contact is formed in the MOS capacitor of the existing peripheral circuit region, so that the MOS capacitor and the reservoir capacitor cannot be used simultaneously.

BRIEF SUMMARY OF THE INVENTION

Various embodiments of the invention are directed to using a Metal Oxide Semiconductor (MOS) capacitor and a reservoir capacitor simultaneously when a buried gate of a cell region is applied.

According to an embodiment of the present invention, a method for fabricating a semiconductor device, the method comprising: a semiconductor substrate including a first peripheral circuit region and a second peripheral circuit region; forming a gate over a semiconductor substrate in the second peripheral circuit region; forming an interlayer insulating film on the entire the semiconductor device including the gate; etching the interlayer insulating film in the second peripheral circuit region to form a bit line contact hole; forming a bit line material and a sacrificial film over the interlayer insulating film including the bit line contact hole; and etching the sacrificial film in the first peripheral circuit region to form a trench in the first peripheral circuit region, the trench exposing the bit line material.

Further comprising: forming a gate material in the first peripheral circuit region while the gate is being formed in the second peripheral circuit region. The gate material in the first peripheral circuit region forms of a Metal oxide Semiconductor (MOS) capacitor.

Further comprising patterning the bit line material in the second peripheral circuit region to form a bit line pad. The bit line material has a stack structure including a barrier metal layer, a tungsten layer and a hard mask nitride film. The trench defines a reservoir capacitor region. Further comprising forming a conductive layer in the trench to form a reservoir capacitor.

According to another embodiment of the present Invention A method for fabricating a semiconductor device the method comprising: a semiconductor substrate including a cell region a first peripheral circuit region and a second peripheral circuit region; forming a buried cell gate and landing plug contact in the semiconductor substrate in the cell region; forming a gate material over the semiconductor substrate in the first and second peripheral circuit regions; patterning the gate material in the second peripheral circuit region to form a peri-gate; forming a storage node contact and a bit line in the cell region each of which is electrically coupled with the landing plug contact in the cell region; forming an interlayer insulating film over the semiconductor substrate including the bit line and the storage node contact of the cell region, over the gate material of the first peripheral circuit region and over the semiconductor substrate including the peri-gate in the second peripheral circuit region; etching the interlayer insulating film to form a peri-bit line contact hole exposing the peri-gate; forming a bit line material in the peri-bit line contact hole over the semiconductor substrate in the first peripheral circuit region; patterning the bit line material in the second peripheral circuit region to form a bit line pad; forming a sacrificial film over the interlayer insulating film in the cell region, over the bit line material in the first peripheral circuit region and over the bit line pad in the second peripheral circuit region; and etching the sacrificial film in the first peripheral circuit region and in the cell region to form a cell trench exposing the storage node contact in the cell region and form a peri-trench exposing the bit line material in the first peripheral circuit region.

The gate material in the first peripheral circuit region defines part of a MOS capacitor. The bit line material has a stack structure including a barrier metal layer, a tungsten layer and a hard mask nitride film.

The cell trench formed in the cell region defines a storage node region. The peri trench formed in the first peripheral circuit region defines a reservoir capacitor region.

Further comprising forming e conductive layer in the cell trench and peri trench to form a storage node, thereby forming a reservoir capacitor.

According to an embodiment of the present invention, a reservoir capacitor of a semiconductor device, the reservoir capacitor comprising: a semiconductor substrate comprising a first peripheral circuit region and a second peripheral circuit region; a gate formed over the semiconductor substrate in the second peripheral circuit region; a bit line pad formed over the gate to be electrically coupled to the gate; a bit line material formed in the first peripheral circuit region of the same layer as the bit line pad; and a trench formed to exposed the bit line material in the first peripheral circuit region. The trench formed in the first peripheral circuit region defines a reservoir capacitor region.

Further comprising a MOS capacitor formed under the trench in the first peripheral circuit region, wherein the MOS capacitor is formed of the same material as the gate. The gate in the second peripheral circuit region and the MOS capacitor in the first peripheral circuit region has a deposition structure including a gate oxide, a gate poly silicon and a hard mask.

Further comprising forming a conductive layer in the trench. The bit line pad has a deposition structure including a barrier metal layer, a tungsten layer and a hard mask nitride film.

According to an embodiment of the present invention, semiconductor device comprises: a first peripheral circuit region and a second peripheral circuit region, wherein the first peripheral circuit region comprises: a metal-oxide-semiconductor (MOS) capacitor pattern formed over a substrate; and a reservoir capacitor pattern formed over the MOS capacitor pattern, and wherein the second peripheral circuit region comprises: a gate formed over the substrate; and a bit line pad formed over the gate to be electrically coupled to the gate, and wherein the reservoir capacitor pad is formed at the substantially same level as the bit line pad formed in the second peripheral circuit region.

The reservoir capacitor pad is formed of the same material as the bit line pad. The reservoir capacitor pad and the bit line pad are formed simultaneously at the same processing step.

BRIEF DESCRIPTION OF THE DRAWINGS

FIGS. 1a to 1h are cross-sectional diagrams illustrating a reservoir capacitor of a semiconductor device and a method for fabricating the same according to an embodiment of the present invention.

DESCRIPTION OF EMBODIMENTS

The present invention will be described in detail h reference to the attached drawings.

FIGS. 1a to 1h are cross-sectional diagrams illustrating a reservoir capacitor of a semiconductor device and a method for fabricating the same according to an embodiment of the present invention. Views (I), (II) and (III) show a cell region, a first peripheral circuit region where a reservoir capacitor is formed, and a second peripheral circuit region, respectively. In this embodiment, the method for fabricating a reservoir capacitor can increase the efficiency by using a process for forming a gate, a bit line and a capacitor in the cell region.

Figure 1A:
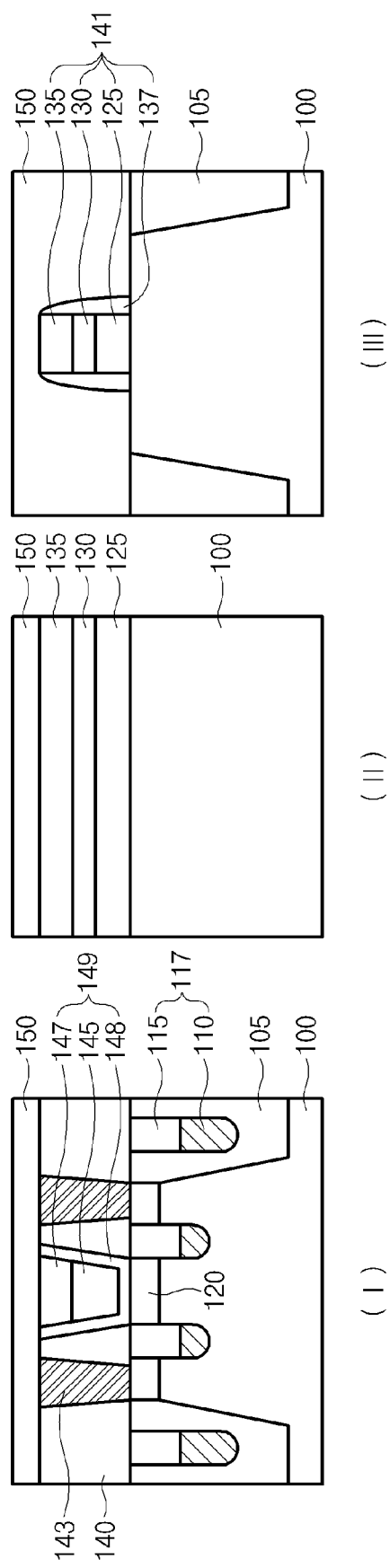

Referring to FIG. 1a, a device isolation film 105 is formed in a semiconductor substrate 100, and a buried gate 117 is formed in the semiconductor substrate 100 of the cell region (I). A landing plug 120 is formed in the semiconductor substrate 100 between the buried gates 117. After the semiconductor substrate 100 is etched to form a recess, the recess is filled with a tungsten layer 110 and a nitride film 115, thereby forming the buried gate 117.

On the upper portion of the semiconductor substrate 100 of the first peripheral circuit region (II) and the second peripheral circuit region (III) except the cell region (I), a deposition structure including a gate oxide film (not shown), a gate polysilicon layer 125, a gate metal layer 130 and a gate hard mask layer 135 are formed. The gate metal layer 130 includes a tungsten layer. The gate hard mask layer 135 includes a nitride film. The gate hard mask layer 135 is formed to have a thickness ranging from 500 to 700 Å.

The deposition structure of the second peripheral circuit region (III) is patterned to form a gate pattern. A spacer 137 is formed at sidewalls of the gate pattern to form a gate 141.

The deposition structure formed in the first peripheral circuit region (II) is not patterned. The deposition structure is used as a Metal Oxide Semiconductor (MOS) capacitor.

After a first mask pattern (not shown) that opens the cell region (I) is formed, a first interlayer insulating film 140 is formed only on the upper portion of the cell region (I). The first interlayer insulating film 140 is etched to form a bit line region (not shown) and a storage node contact hole that exposes the landing plug 120.

The storage node contact hole is filled with a polysilicon layer to form a storage node contact 143. A barrier metal layer 148 is deposited on the inside all of the bit line region (not shown), and the bit line region is filled with the tungsten layer 145 and the hard mask nitride film 147, thereby forming a bit line 149. The hard mask nitride film 147 is formed to have a thickness ranging from 500 to 700 Å. The first mask pattern (not shown) that opens the cell region (I) is removed.

A second interlayer insulating film 150 is formed on the upper portion of the semiconductor substrate 100 including the first interlayer insulating film 140 of the cell region (I) where the bit line 149 and the storage node contact 143 are interposed, the gate hard mask layer 135 of the first peripheral circuit region (II) and the gate 141 of the second peripheral circuit region (III). The second interlayer insulating film 150 is formed with a material including an oxide film to have a thickness ranging from 300 to 400 Å.

Figure 1B:
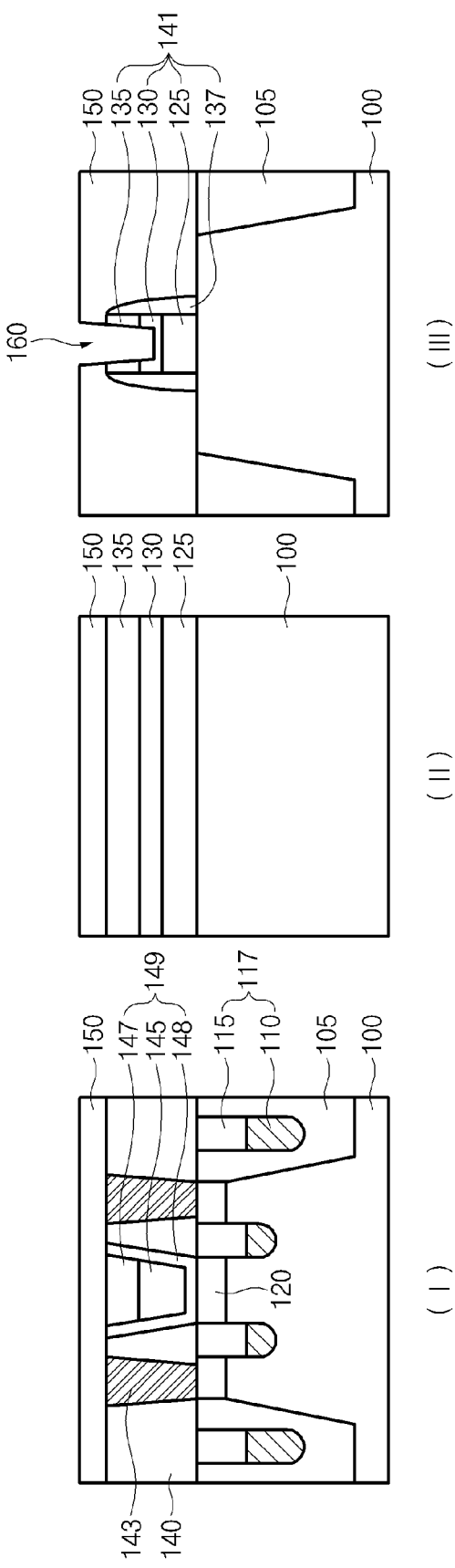

Referring to FIG. 1b, a second mask pattern (not shown) that opens the second peripheral circuit region (III) is formed. A bit line contact hole 160 is formed in the second peripheral circuit region (III). The bit line contact hole 160 is obtained by etching a portion of the second interlayer insulating film 150, the gate hard mask layer 135 and the gate metal layer 130 to expose the gate metal layer 130. The second interlayer insulating film 150 adjacent to the gate 141 may be etched to expose the semiconductor substrate 100.

The second mask pattern (not shown) that opens the second peripheral circuit region (III) is removed.

Figure 1C:
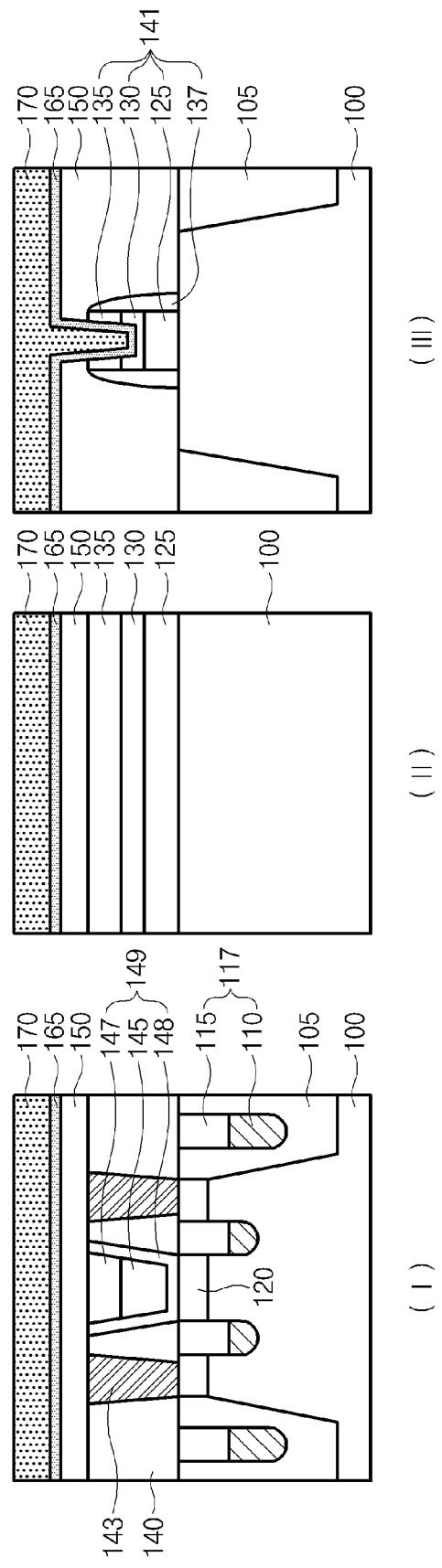

Referring to FIG. 1c, a barrier metal layer 165 and a tungsten layer 170 are deposited on the cell region (I), on the upper portion of the second interlayer insulating film 150 of the first peripheral circuit region (II) and on the upper portion of the second interlayer insulating film 150 including the bit line contact hole 160 of the second peripheral circuit region (III). After the tungsten layer 170 is formed to have a thickness ranging from 700 to 1000 Å, a Chemical Mechanical Polishing (CMP) process is performed so that the remaining tungsten layer 170 has a thickness ranging from 300 to 600 Å.

Figure 1D:
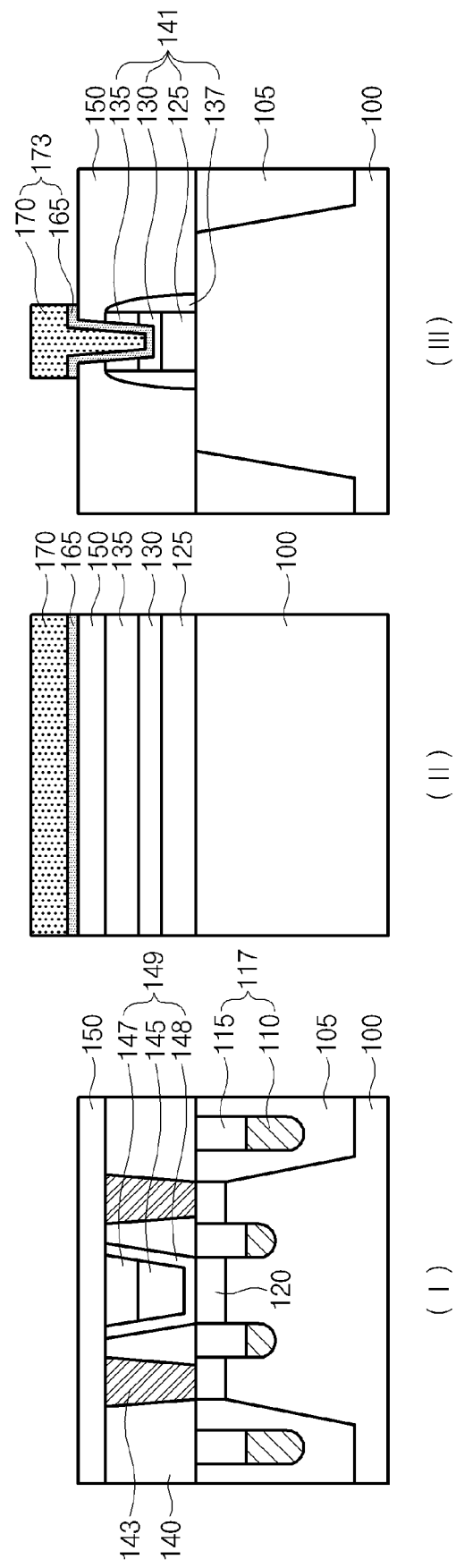

Referring to FIG. 1d, the tungsten layer 170 and the barrier metal layer 165 of the second peripheral circuit region (III) are patterned to form a bit line pad 173. The tungsten layer 170 and the barrier metal layer 165 of the cell region (I) are removed, and the tungsten layer 170 and the barrier metal layer 165 of the first peripheral circuit region (II) remain.

Figure 1E:
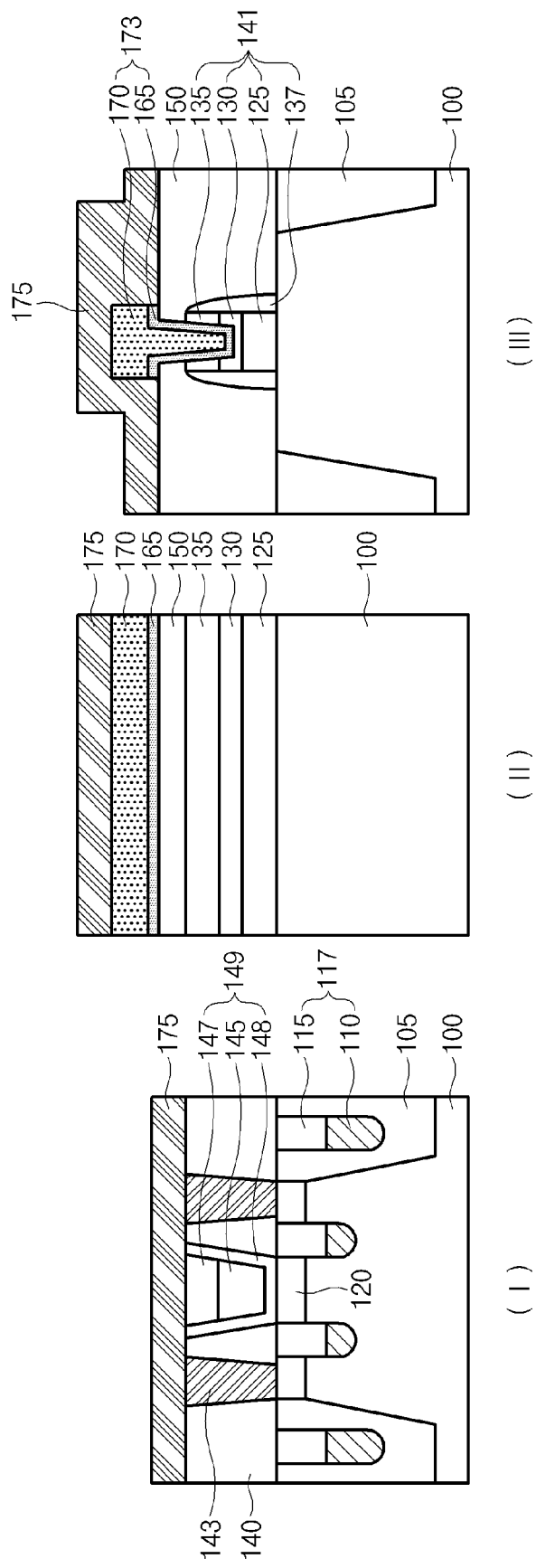

Referring to FIG. 1e, the second interlayer insulating film 150 of the cell region (I) is removed.

Figure 1F:
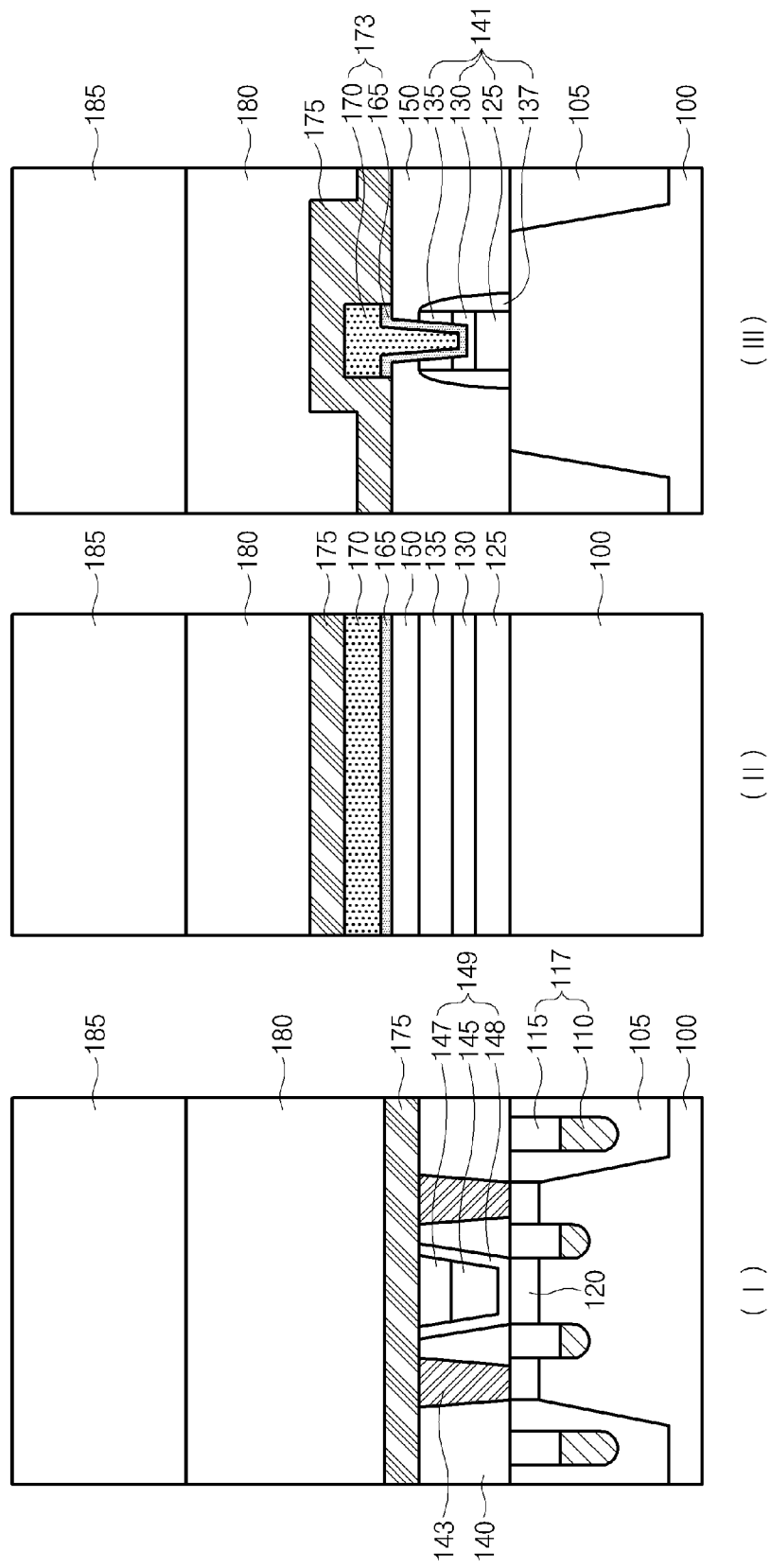

Referring to FIG. 1f, an etch barrier film 175 is deposited on the upper portion of the first interlayer insulating film 140 including the storage node contact 143 and the bit line 149 of the cell region (I), on the upper portion of the tungsten layer 170 of the first peripheral circuit region (II), and on the upper portion of the first interlayer insulating film 150 including the bit line pad 173 of the second peripheral circuit region (III). The etch barrier film 175 is deposited in order to form a reservoir capacitor of the first peripheral circuit region (II), and is formed with a material including a nitride film to have a thickness ranging from 500 to 600 Å.

Even when an overlay between the storage node contact 143 and the storage node region of the cell region (I) is dislocated, the thickness of the combined etch barrier film 175 and the hard mask nitride film 147 of the bit line 149 ranges from 1000 to 1300 Å, so that an electric short does not occur between the storage node of the cell region (I) and the bit line 149 of the cell region (I).

Referring to FIG. 1f a first sacrificial film 180 and a second sacrificial film 185 are formed on the upper portion of the etch barrier films 175 in the cell region (I), the first peripheral circuit region (II) and the second peripheral circuit region (III). The first sacrificial film 180 and the second sacrificial film 185 are formed with material including an oxide film, more preferably, a Phosphors Silicate Glass (PSG) oxide film and TetraEthOxySilane (TEOS) oxide film, respectively.

Referring to FIG. 1g, the second sacrificial film 185, the first sacrificial film 180 and the etch barrier film 175 of the cell region (I) are etched to form a storage node region 190 that exposes the storage node contact 143. In the etching process of the storage node region 190 of the cell region (I), the second sacrificial film 185, the first sacrificial film 180 and the etch barrier film 175 of the first peripheral circuit region (II) are simultaneously etched to form a reservoir capacitor region 195 that exposes the tungsten layer 170.

Referring to FIG. 1h, a subsequent process for depositing a conductive layer 197 is performed in the storage node region 190 of the cell region (I) and the reservoir capacitor region 195 of the first peripheral circuit region (II). As a result, a storage node is formed in the cell region (I), and a reservoir capacitor is formed in the first peripheral circuit region (II).

As described above, a reservoir capacitor using a bit line pad is formed so that a MOS capacitor and a reservoir capacitor can be used simultaneously.

The reservoir capacitor is not limited in the method shown in FIGS. 1a to 1h.

The reservoir capacitor of the semiconductor device is described with reference to FIG. 1h. Here, the cell region is not described, but only the peripheral circuit regions where a MOS capacitor and a reservoir capacitor are formed are described.

The semiconductor substrate 100 is prepared where the first peripheral circuit region (II) where the reservoir capacitor is formed and the second peripheral circuit region (III) are defined. The gate 141 is disposed on the upper portion of the semiconductor substrate 100 of the second peripheral circuit region (III). The gate 141 has a deposition structure including the gate oxide film (not shown), the gate polysilicon layer 125, the gate metal layer 130 and the gate hard mask layer 135. The spacer 137 is disposed at sidewalls of the deposition structure. The deposition structure is not patterned but remains in the first peripheral circuit region (II). The deposition structure is used as a Metal Oxide Semiconductor (MOS) capacitor.

The bit line pad 173 is disposed on the upper portion of the gate 141 of the second peripheral circuit region (III). The bit line pad 173 is coupled to the gate 141 or to the semiconductor substrate 100. The bit line pad 173 includes the barrier metal layer 165 and the tungsten layer 170. Also, the barrier metal layer 165 and the tungsten layer 170 are disposed in the first peripheral circuit region (II).

The reservoir capacitor region 195 that exposes the tungsten layer 170 is located in the first peripheral circuit region (II). As a result, the reservoir capacitor including the conductive layer 197 is disposed in the reservoir capacitor region 195.

As described above, the reservoir capacitor according to an embodiment of the present invention is fabricated while the bit line pad 173 is formed. Thus, the reservoir capacitor is formed independently from the step of forming the MOS capacitor located under the reservoir capacitor. As a result, both of the MOS capacitor and the reservoir capacitor can be formed.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claim.

What is claimed is:

1. A semiconductor device, comprising:
   a semiconductor substrate including a cell region, a first peripheral circuit region and a second peripheral circuit region;
   a buried cell gate and a landing plug contact disposed in the semiconductor substrate in the cell region;
   a bit line disposed in the cell region;
   a peri-gate disposed over the semiconductor substrate in the second peripheral circuit region, wherein the peri-gate is disposed in a substantially same level as the bit line of the cell region;
   a bit line pad disposed over the peri-gate, the bit line pad being electrically coupled to the peri-gate;
   a bit line material layer disposed over the semiconductor substrate in the first peripheral circuit region, the bit line material layer including a same material as the bit line pad;
   a trench exposing the bit line material layer in the first peripheral circuit region; and
   a reservoir capacitor including a conductive layer disposed in the trench,
   wherein the semiconductor device further comprises a MOS capacitor disposed under the trench in the first peripheral circuit region, the MOS capacitor being comprised of a same material as the peri-gate.

2. The semiconductor device according to claim 1, wherein the peri-gate in the second peripheral circuit region and the MOS capacitor in the first peripheral circuit region have a deposition structure including a poly silicon layer and a hard mask layer.

3. The semiconductor device according to claim 1, wherein the bit line pad has a deposition structure including a barrier metal layer and a tungsten layer.

4. The semiconductor device according to claim 1, further comprising a storage node contact in the cell region, the storage node contact and the bit line being electrically coupled to the landing plug contact in the cell region.

5. The semiconductor device according to claim 4, further comprising a storage node disposed over the storage node contact.

6. The semiconductor device according to claim 1, wherein the bit line pad partially extends into the peri-gate.

7. The semiconductor device according to claim 1, further comprising:
   an etch barrier film disposed on the bit line of the cell region, on the bit line material layer of the first peripheral circuit region, and on the bit line pad of the second peripheral circuit region.

8. The semiconductor device according to claim 1, further comprising:
   a landing plug disposed under the bit line in the cell region, the landing plug being disposed at a lower level than the peri-gate of the second peripheral circuit region.

9. A semiconductor device comprising:
a cell region;
a first peripheral circuit region; and
a second peripheral circuit region,
wherein the cell region includes a bit line, and further includes a buried cell gate and a landing plug contact that are disposed in a substrate,
wherein the first peripheral circuit region comprises a metal-oxide-semiconductor (MOS) capacitor pattern disposed over the substrate and a reservoir capacitor pattern disposed in a trench that exposes a bit line material layer, the bit line material layer being disposed over the MOS capacitor pattern, and
wherein the second peripheral circuit region comprises a peri-gate disposed over the substrate and a bit line pad including a same material as the bit line material layer and disposed over the peri-gate, the bit line pad electrically coupled to the peri-gate, the peri-gate being disposed in a substantially same level as the bit line.

10. The semiconductor device of claim 9, wherein a lower surface of the reservoir capacitor pattern is disposed below an upper surface of the bit line pad disposed in the second peripheral circuit region.

11. The semiconductor device according to claim 9, wherein the bit line pad partially extends into the peri-gate.

12. The semiconductor device according to claim 9, further comprising:
an etch barrier film disposed on the bit line of the cell region, on the bit line material layer of the first peripheral circuit region, and on the bit line pad of the second peripheral circuit region.

13. The semiconductor device according to claim 9, wherein the landing plug is disposed under the bit line in the cell region, the landing plug being disposed at a lower level than the peri-gate of the second peripheral circuit region.

* * * * *